United States Patent
Hastings

(10) Patent No.: US 11,289,245 B2
(45) Date of Patent: *Mar. 29, 2022

(54) RESISTOR REPLICATOR

(71) Applicant: Texas Instruments Incorporated, Dallas, TX (US)

(72) Inventor: Roy Alan Hastings, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/911,039

(22) Filed: Jun. 24, 2020

(65) Prior Publication Data
US 2020/0321149 A1   Oct. 8, 2020

Related U.S. Application Data

(63) Continuation of application No. 16/286,325, filed on Feb. 26, 2019, now Pat. No. 10,734,140.

(51) Int. Cl.
*H01C 1/16* (2006.01)
*H03M 1/38* (2006.01)
*H03M 1/66* (2006.01)

(52) U.S. Cl.
CPC ............ *H01C 1/16* (2013.01); *H03M 1/38* (2013.01); *H03M 1/66* (2013.01)

(58) Field of Classification Search
CPC .............. H01C 1/16; H03M 1/66; H03M 1/38
See application file for complete search history.

(56) References Cited

U.S. PATENT DOCUMENTS

| | | | |
|---|---|---|---|
| 6,804,697 B2 | 10/2004 | Bugeja et al. | |
| 8,330,447 B2 * | 12/2012 | Hawkins | G01R 21/01 324/98 |
| 2011/0267140 A1 | 11/2011 | Kim | |

* cited by examiner

*Primary Examiner* — Jung Kim
(74) *Attorney, Agent, or Firm* — Ray A. King; Charles A. Brill; Frank D. Cimino

(57) ABSTRACT

In an example, a device comprises a first resistor coupled to a second resistor and to a trim resistor, the second resistor and the trim resistor coupled to a port configured to couple to a third resistor. The device also comprises a comparator having an inverting input coupled to a first node between the second resistor and the port and a non-inverting input coupled to a second node between the first resistor and the trim resistor. The device further includes a trim control circuit coupled to an output of the comparator and having an output coupled to the trim resistor, the trim control circuit configured to couple to multiple integrated trim resistors external to the device.

20 Claims, 6 Drawing Sheets

RESISTOR REPLICATOR

This application is a continuation of U.S. patent application Ser. No. 16/286,325, filed Feb. 26, 2019, which issued as U.S. Pat. No. 10,734,140, the contents of which are herein incorporated by reference in its entirety.

SUMMARY

In an example, a device comprises a first resistor coupled to a second resistor and to a trim resistor, the second resistor and the trim resistor coupled to a port configured to couple to a third resistor. The device also comprises a comparator having an inverting input coupled to a first node between the second resistor and the port and a non-inverting input coupled to a second node between the first resistor and the trim resistor. The device further includes a trim control circuit coupled to an output of the comparator and having an output coupled to the trim resistor, the trim control circuit configured to couple to multiple integrated trim resistors external to the device.

In an example, a system comprises a device, the device comprising a first resistor coupled to a second resistor and to a trim resistor, the trim resistor and the second resistor coupled to a port that is configured to couple to a resistor external to the device. The device also comprises a comparator coupled to the trim resistor and to the first resistor. The device also comprises a counter coupled to the comparator and configured to adjust a digital code in response to an output of the comparator and to apply the digital code to the trim resistor. The counter is further configured to apply the digital code to multiple integrated trim resistors external to the device.

In an example, a method comprises comparing a first voltage at a first node in a Wheatstone bridge to a second voltage at a second node in the Wheatstone bridge, the Wheatstone bridge comprising a trim resistor and another resistor. The method also includes adjusting a counter value based on the comparison and trimming the trim resistor based on the adjusted counter value. The method comprises trimming multiple integrated trim resistors based on the adjusted counter value, the multiple integrated trim resistors external to the device containing the trim resistor.

In an example, a system comprises a device, the device comprising a first resistor; a second resistor coupled to the first resistor by way of a hysteresis resistor; and a trim resistor coupled to the second resistor. The device also comprises a port coupled to the trim resistor, the port configured to couple to a resistor external to the device. The device comprises a first comparator coupled to the first and hysteresis resistors and to the port. The device includes a second comparator coupled to the second and hysteresis resistors and to the trim resistor, and an up/down counter coupled to outputs of the comparators, the up/down counter comprising an output coupled to the trim resistor.

BRIEF DESCRIPTION OF THE DRAWINGS

For a detailed description of various examples, reference will now be made to the accompanying drawings in which.

DETAILED DESCRIPTION

Figure 1A:
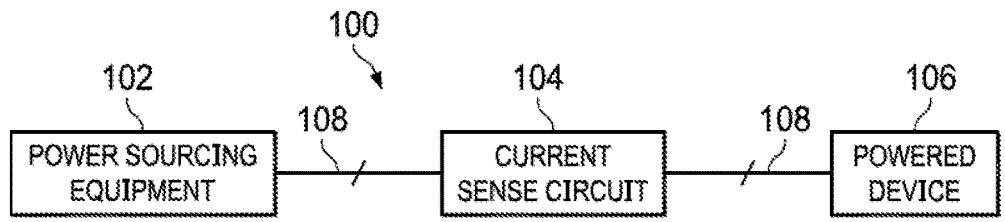
FIG. 1A depicts a block diagram of a power over Ethernet (POE) system comprising a current sense circuit, in accordance with an example.

Various electronic systems benefit from the use of current sensing devices to monitor current levels. For example, preventative measures can be taken if a current sensing device indicates that current levels are inappropriately high. One such electronic system that benefits from current sensing is the power over Ethernet (POE) system. A POE system includes a power source, a power device (or load), and an Ethernet connection between the power source and device. Current is often monitored on the Ethernet connection to mitigate various problems that may occur as a result of, e.g., inappropriately high current levels.

Current is often measured using a resistor that is placed in the current path. A voltage is measured across the resistor, and Ohm's law is then used to calculate the current based on the measured voltage and the known resistance of the resistor. In applications containing multiple parallel current paths, multiple such current sense resistors can be used. In some cases, the current levels are too large to be measured using a current sense resistor (or doing so is cost prohibitive), and so a current mirror including power and sense transistors (e.g., field effect transistors (FETs)) is used to measure a sense current that is proportionally smaller relative to the actual current supplied to the load. Alternatives to current mirrors include magnetic sensors (e.g., Hall effect devices, flux gates) and bond wires or die metallization as sense resistors.

While the foregoing technique can sometimes yield results of acceptable quality, the sense resistors that are used are susceptible to environmental influences, particularly temperature variations. Premium quality resistors that are largely resistant to temperature influences (e.g., thin film resistors, thick film resistors, bulk metal oxide resistors, low temperature coefficient metal resistors composed of, e.g., manganin) are prohibitively expensive in many applications, including POE. Current sense resistors can be re-positioned outside of the die package (known as an external resistor) to avoid some of the deleterious environmental influences, but these external resistors should be high-precision, high current resistors, so they are still cost prohibitive. Thus, engineers are often faced with the choice between using multiple high-quality, expensive resistors or using low-cost resistors that are susceptible to temperature variations.

Described herein are various examples of a current sense circuit that uses a single high-quality, external resistor (e.g., thin film resistor) in tandem with a trim resistor in a Wheatstone bridge configuration. The current sense circuit uses a comparator and a trim control circuit (e.g., an up-down counter, a successive approximation register) to adjust the trim resistor such that voltages on opposing nodes of the Wheatstone bridge are balanced. The trim setting applied to the trim resistor is applied to any number of trim resistors that are subject to the same or similar environmental conditions as the trim resistor. The trim resistors (exclusive of the trim resistor in the Wheatstone bridge) are integrated trim resistors, meaning that they are physically configured to mitigate the effects of minor temperature gradients (e.g., using a common centroid configuration, such as an interdigitation technique).

An advantage of this circuit is that the superior performance of the premium external resistor is leveraged and extended to numerous less expensive trim resistors, thereby gaining the performance benefits of premium resistors without the associated costs. Specifically, the resistors of the Wheatstone bridge, which include the premium external resistor and the less expensive trim resistor, stay balanced by maintaining a constant ratio of resistances. When the ratio of resistances between the Wheatstone bridge resistors becomes imbalanced, the circuit adjusts the trim resistor to restore the target resistance ratios within the Wheatstone bridge. In this way, when the trim resistor is exposed to, e.g., temperature variations, it responds not in the usual manner that a less expensive and lower quality resistor would respond, but rather it maintains parity with the premium external resistor. In this manner, the trim resistor is forced to behave similarly to the premium external resistor. Moreover, the digital signals used to control the behavior of the trim resistor to match that of the premium external resistor can be applied to any number of additional trim resistors that are external to the device containing the trim resistor. In this way, any number of external trim resistors can be forced to emulate the behavior of the premium external resistor, regardless of temperature variations or other influences that would otherwise cause a change in resistance values of the external trim resistors. This circuit thus produces any number of resistors that behave like a premium resistor but at a fraction of the cost.

FIG. 1A depicts a block diagram of a power over Ethernet (POE) system 100 in accordance with an example. The POE system 100 includes power sourcing equipment 102 (e.g., in accordance with IEEE802.3af) and a powered device 106 (e.g., a load, such as in IEEE802.3af). The power sourcing equipment 102 provides power to the powered device 106 via a multi-channel Ethernet connection 108. A current sense circuit 104, as described below, is positioned in the path of the current flowing through the channels of the Ethernet connection 108 to sense the current. Although the examples described below are presented in the context of the POE system 100, the examples can be implemented in any of a variety of applications.

Figure 1B:
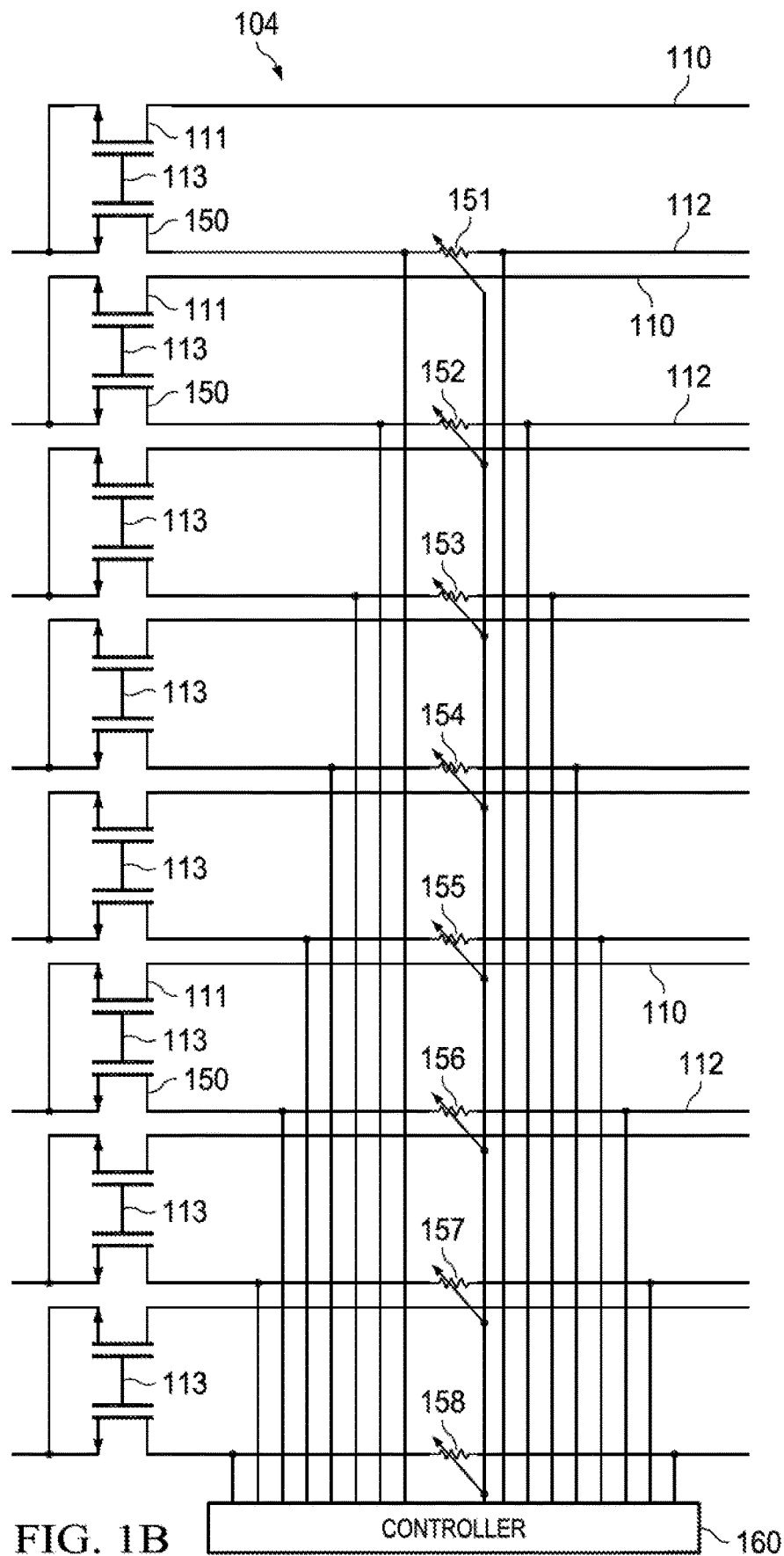
FIG. 1B depicts a circuit schematic diagram of a current sense circuit in accordance with an example.

FIG. 1B depicts a circuit schematic diagram of the current sense circuit 104 in accordance with an example. The current sense circuit 104 includes multiple current sense channels 112, each carrying a current as determined by a sizing ratio between the respective sense FET 150 and a corresponding power FET 111. (A voltage potential exists on each current sense channel 112 such that current is induced to flow through the external trim resistors 151-158.) An external trim resistor 151-158 is positioned on each of the sense channels 112. The power FET 111 couples to a channel 110. The external trim resistors 151-158 are trimmable by a current sense circuit controller 160. The controller 160 couples to each of the channels 110 such that it is configured to measure the voltage across each of the external trim resistors 151-158. In operation, the controller 160 trims the external trim resistors 151-158 by leveraging a premium quality resistor (e.g., thin film resistor) as mentioned above and as described in further detail below. This trimming of the external trim resistors 151-158 mitigates the effects of temperature variations on the external trim resistors 151-158. Each of the external trim resistors 151-158 has any suitable structural configuration, e.g., an individual trim resistor can comprise a string DAC, a binary-weighted DAC, etc. The gates of the FETs 111, 150 are controlled by an input 113, which is provided by any suitable control circuit.

Figure 2:
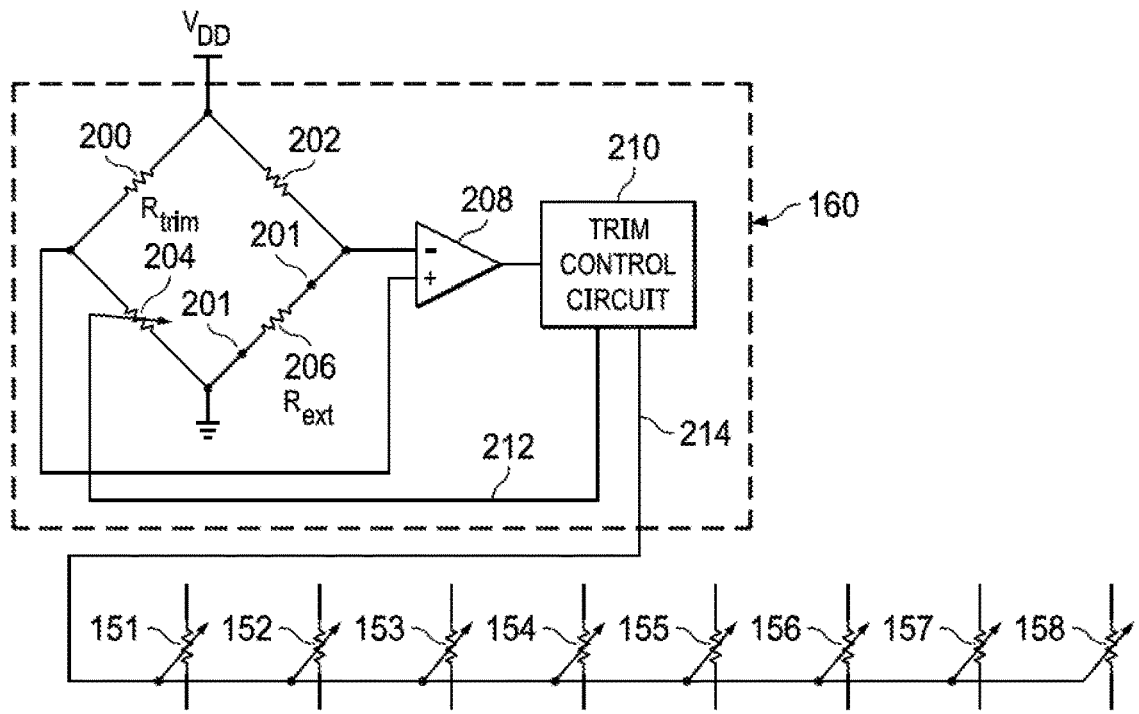
FIG. 2 depicts a circuit schematic diagram of a current sense circuit controller coupled to multiple integrated trim resistors in accordance with an example.

FIG. 2 depicts a circuit schematic diagram of the current sense circuit controller 160 coupled to the multiple external trim resistors 151-158 in accordance with an example. The depictions of controller 160 provided herein are partial and not necessarily exhaustive. The controller 160 includes a resistor 200, a resistor 202, and a trim resistor 204 (e.g., a string DAC or a binary-weighted DAC). The controller 160 further comprises an external resistor 206. In some examples, the external resistor 206 is formed on a separate integrated circuit die that is external to the controller 160. In some such examples, the external resistor 206 is external to a package that houses the die on which the remainder of the controller 160 is formed. In another example, the external resistor 206 is formed on the same die as the remainder of the controller 160. In some examples, all components shown in FIG. 2, other than the external resistor 206, are formed on the same integrated circuit die, or are at least housed within the same package. The controller 160 includes a port 201 through which it couples to the external resistor 206.

Together, the resistors 200, 202, 204, and 206 form a Wheatstone bridge. A node between the resistors 200, 202 couples to a voltage source VDD. A node between the resistors 204, 206 couples to ground. A node between the resistors 200, 204 couples to a non-inverting input of a comparator 208. A node between the resistors 202, 206 couples to an inverting input of the comparator 208. As with other input connections described herein, the inputs to the comparator 208 are reversible, provided that the trim control circuit 210 is modified accordingly.

As described below, the trim resistor 204 is adjustable to maintain a ratio between the resistors 200 and 204 that matches (or approximately matches, e.g., within plus or minus 10%) the ratio between the resistors 202 and 206. Any suitable resistance values may be chosen for the resistors 200, 202, 204, and 206. In one example, the resistance values are 115 kilohms, 12.78 kilohms, 135 kilohms (trimmable), and 15 kilohms, respectively. Thus, in this example, the ratio between resistors 202 and 206 is approximately 0.85, and the trim resistor 204 is adjustable to maintain an approximately 0.85 ratio between resistors 202 and 204. According to one aspect of the present disclosure, one or more of the resistors 200, 202, 204, and/or 206 are integrated via, e.g., interdigitation and/or a common centroid configuration. In an example, the trim resistor 204 is integrated (e.g., via interdigitation and/or a common centroid configuration) with the external trim resistors 151-158. Other variations are contemplated and included in the scope of this disclosure.

An output of the comparator 208 couples to a trim control circuit 210. A first output 212 of the trim control circuit 210 couples to the trim resistor 204. For example, the trim control circuit 210 outputs a digital code on the first output 212, and the digital code causes the trim resistor 204 to change its resistance. A second output 214 of the trim control circuit 210 couples to the external trim resistors 151-158 so that the resistors 151-158 are not trimmed while resistor 204 is being trimmed, although such simultaneous trimming is contemplated and included in the scope of this disclosure. For example, the trim control circuit 210 outputs a digital code on the second output 214, and this digital code causes the external trim resistors 151-158 to change their resistances.

In an example, the trim control circuit 210 is a successive approximation register (SAR), such as is used in successive approximation analog-to-digital converters (ADCs). In another example, the trim control circuit 210 is a counter, such as an up-down counter. Other logic may be used for the trim control circuit 210.

In an example, the multiple external trim resistors 151-158 are integrated, meaning that they are matched using a technique such as interdigitation and/or a common centroid configuration. Such integration (or matching) facilitates a common response to temperature gradients and other environmental influences on the multiple external trim resistors 151-158.

In operation, the comparator 208 detects the voltages at its inputs and outputs either a logic high or a logic low, depending on which of the inputs receives a higher voltage. The trim control circuit 210 receives the output of the comparator 208. Based on the output of the comparator 208, the trim control circuit 210 adjusts its digital code output either upward or downward. For example, adjusting the digital code output upward can cause the resistance of the trim resistor 204 to increase, and adjusting the digital code output downward can cause the resistance of the trim resistor 204 to decrease. In this way, the trim control circuit 210 continually adjusts the digital code to maintain the target resistance ratios in the Wheatstone bridge among resistors 200, 202, 204, and 206. Assuming that the trim control circuit 210 comprises a SAR, and further assuming that the digital code on output 212 is initially a set of zeros, the trim control circuit 210 first changes the most significant bit (MSB) in the digital code to a 1. The trim control circuit 210 also determines whether the resulting resistance of the trim resistor 204 produces a voltage at the non-inverting input of comparator 208 that is too high relative to the other input of the comparator 208. If the resistance of the trim resistor 204 is too large, the trim control circuit 210 changes the MSB back to a 0. If, however, the resistance of the trim resistor 204 is still too small, the trim control circuit 210 leaves the MSB set to a 1. Next, the trim control circuit 210 changes the next-to-MSB (also called the second MSB) to a 1. If the resistance of the trim resistor 204 becomes too large, the trim control circuit 210 changes the second MSB back to a 0. Otherwise, if the resistance of the trim resistor 204 is still too small, the trim control circuit 210 leaves the second MSB set to a 1. This process is repeated for all bits of the digital code on the output 212. Once a suitable digital code is identified, the trim control circuit 210 outputs that digital code on the output 214 and trims each of the external trim resistors 151-158 with that entire digital code. For example, the full digital code is applied to the external trim resistor 151, and that same full digital code is also applied to external trim resistor 152. The process may then begin again immediately, or after any desired delay.

It is possible that environmental conditions exist near the trim resistor 204 that would typically cause a change in the resistance of low-cost, low-quality resistors. However, the feedback mechanism comprising the comparator 208, the trim control circuit 210, and the output 212 dynamically adjusts the trim resistor 204 to maintain the aforementioned ratios within the Wheatstone bridge, thus effectively forcing the trim resistor 204 to react to its environment in a manner similar to the external resistor 206. The code applied to the trim resistor 204 can be applied to any number of trim resistors, e.g., external trim resistors 151-158. This effectively produces a multitude of inexpensive, low-quality trim resistors that behave like the expensive external resistor 206 even in the face of environmental influences, e.g., temperature variations. This can be useful in the power-over-Ethernet context or in any other application in which multiple resistors would be useful.

Figure 3:
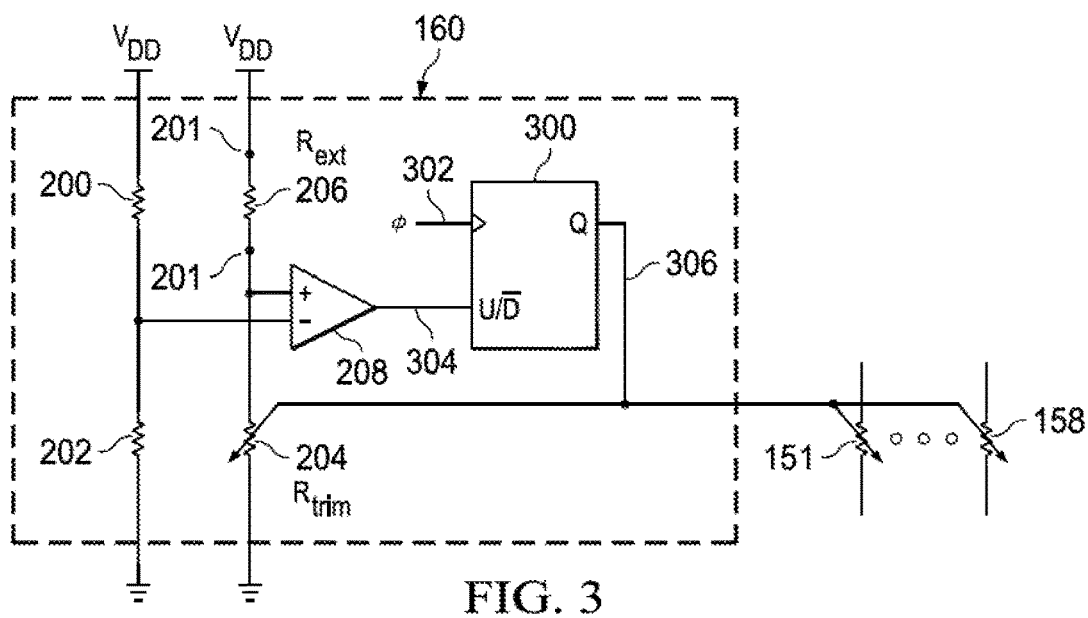
FIG. 3 depicts a circuit schematic diagram of another current sense circuit controller coupled to multiple integrated trim resistors in accordance with an example.

FIG. 3 depicts a circuit schematic diagram of another current sense circuit controller 160 in accordance with an example. The example controller 160 depicted in FIG. 3 differs from that shown in FIG. 2 in that the configuration of the Wheatstone bridge is different, and the trim control circuit 210 of FIG. 2 is implemented as an up-down counter 300 in FIG. 3. (In other examples, any other suitable Wheatstone bridge configuration(s) are usable, so long as each such configuration includes a reference resistor, a trim resistor, and two matched resistors.) More specifically, the controller 160 of FIG. 3 still includes the Wheatstone bridge resistors 200, 202, 204, and 206, but these resistors are configured differently than in FIG. 2 to provide another example. In practice, any configuration of resistors may be used in the Wheatstone bridge, so long as a trim resistor 204 is present for trimming to maintain the aforementioned resistor ratios. The up-down counter 300 includes a clock input 302 that couples to a clock, an up-down input 304 that couples to the output of the comparator 208, and an output 306 that couples to the trim resistor 204 and the multiple integrated external trim resistors 151-158.

In operation, the comparator 208 detects an imbalance between the voltages on its inputs and outputs a logic low or a logic high accordingly. This logic signal is provided to the up-down input 304. At a next clock edge received at clock input 302, the up-down counter 300 reads the output of the comparator 208 received at up-down input 304. If a logic low is received at up-down input 304, the up-down counter 300 causes the counter to begin decrementing, and if a logic high is received at up-down input 304, the up-down counter 300 causes the counter to begin incrementing. The counter values are continuously output onto output 306 until the next clock edge is received at clock input 302 and the counter is (possibly) manipulated to alter its upward or downward trajectory. Thus, for example, the inputs to the comparator 208 indicate that the resistance of the trim resistor 204 is not sufficiently high, and so the up-down input 304 receives a logic high signal. Accordingly, at the next clock edge, the up-down counter 300 begins incrementing its counter (if it was not doing so already), and the digital code output at output 306 causes the trim resistor 204 to be trimmed so that its resistance is increased. A similar process applies if the comparator 208 determines that the resistance of the trim resistor 204 is too low. The output 306 is shown as coupling to both the trim resistor 204 and the multiple integrated external trim resistors 151-158. In such an example, the digital code output on output 306 is applied roughly simultaneously to the trim resistor 204 as well as the multiple integrated external trim resistors 151-158. In some examples, additional logic is implemented so that the trim resistor 204 is trimmed until the target resistor ratios within the Wheatstone bridge are achieved with an acceptable degree of accuracy, and the digital code with which the trim resistor 204 is trimmed is then applied to the multiple integrated external trim resistors 151-158. Because the comparator 208 is a digital device and will thus always output a value suggesting that the proper resistor ratios have not been achieved within the Wheatstone bridge, such additional logic may include analog circuitry, e.g., an amplifier, coupled to the inputs of the comparator 208 and a capacitor and used in tandem with a reference voltage and additional comparison logic to determine an appropriate time at which to apply the digital code to the multiple integrated external trim resistors 151-158.

Figure 4:
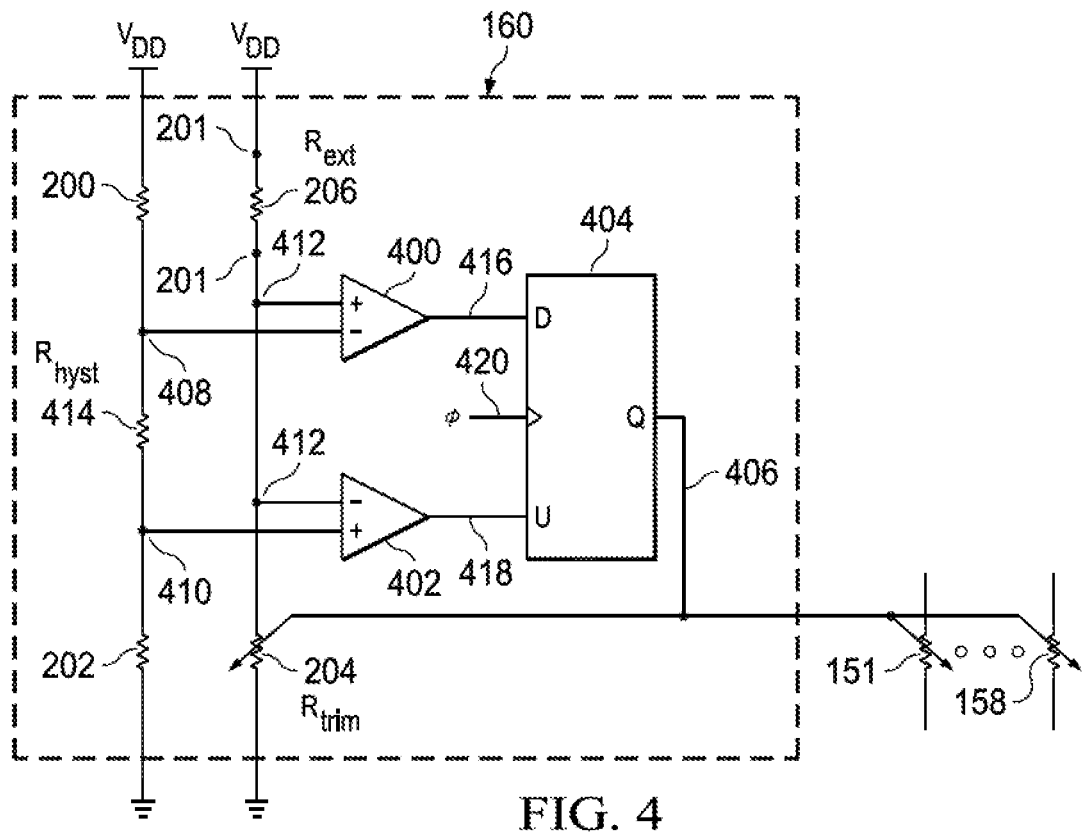
FIG. 4 depicts a circuit schematic diagram of another current sense circuit controller coupled to multiple integrated trim resistors in accordance with an example.

FIG. 4 depicts a circuit schematic diagram of another current sense circuit controller 160 coupled to multiple integrated external trim resistors 151-158 in accordance with an example. The example of controller 160 shown in FIG. 4 comprises the resistors 200, 202, 204, and 206, as well as the port 201, as described above. The controller 160 further comprises a hysteresis resistor 414 that couples to the resistor 200 at a node 408 and to the resistor 202 at a node 410. A comparator 400 has an inverting input that couples to the node 408 and a non-inverting input that couples to a node 412 between the resistors 206, 204. A comparator 402 has an inverting input that couples to the node 412 and a non-inverting input that couples to the node 410. An output of the comparator 400 couples to an input 416 of an up-down counter 404. The input 416, when provided with an asserted signal, causes the up-down counter 404 to count downward. An output of the comparator 402 couples to an input 418 of the up-down counter 404. The input 418, when provided with an asserted signal, causes the up-down counter 404 to count upward. The up-down counter 404 also comprises a clock input 420 and an output 406. The output 406 carries a digital code that is used to trim the trim resistor 204 and the multiple integrated external trim resistors 151-158.

In operation, the comparators 400, 402 function as window comparators, providing a hysteresis band to prevent the controller 160 from constantly searching for the optimal digital code for the trim resistors. As long as the digital code at any given time causes the inputs to the comparators 400, 402 to output logic low signals, the digital code will not change. For example, assume that the voltage at node 408 is fixed at approximately 4V, and the voltage at node 410 is fixed at approximately 3.99V. Further, assume that in this example, the trim resistor 204 is trimmed such that the voltage at node 412 is too high—e.g., 4.5V. In this example, the comparator 400 will output a logic high signal to the input 416, and the comparator 402 will output a logic low signal to the input 418. At the next clock edge, the up-down counter 404 will read the inputs 416 and 418 and, in response, will count downward, since the input 416 is high and the input 418 is low. Counting downward causes the digital code to decrease. The trim resistor 204 is trimmed with this decreasing digital code until the inputs 416, 418 are both logic low.

Continuing with the example, assume now that the voltage at node 412 is too low—e.g., 3.5V. In this situation, the output of the comparator 400 will be logic low, and the output of the comparator 402 will be logic high. The inputs received at 416, 418 cause the up-down counter 404 to count upward starting with the next clock edge. The digital code on output 406 increases and trims the trim resistor 204 until the inputs 416 and 418 are both logic low.

Still continuing with the example, assume now that the voltage at node 412 is in the hysteresis band—e.g., 3.995V.

In this situation, the outputs of both the comparators 400, 402 will be logic low. Thus, at the next clock edge, the up-down counter 404 will not alter the digital code.

The example of FIG. 4 is particularly useful to prevent the controller 160 from constantly searching for the optimal digital code. If the Wheatstone bridge ratios are being controlled within the tolerances provided by the hysteresis band, the controller 160 does not try to further optimize the digital code. Other solutions may be used for a similar objective. For example, the controller 160 of FIG. 3 is modifiable so that the output 306 couples only to the trim resistor 204 and not to the external trim resistors 151-158. Latches are coupled to the output 306 and are configured so that the latches are clocked whenever the input 304 remains the same for a predetermined (e.g., 2) number of clock pulses. The latches generate controls for the trimming of the external trim resistors 151-158.

Figure 5:
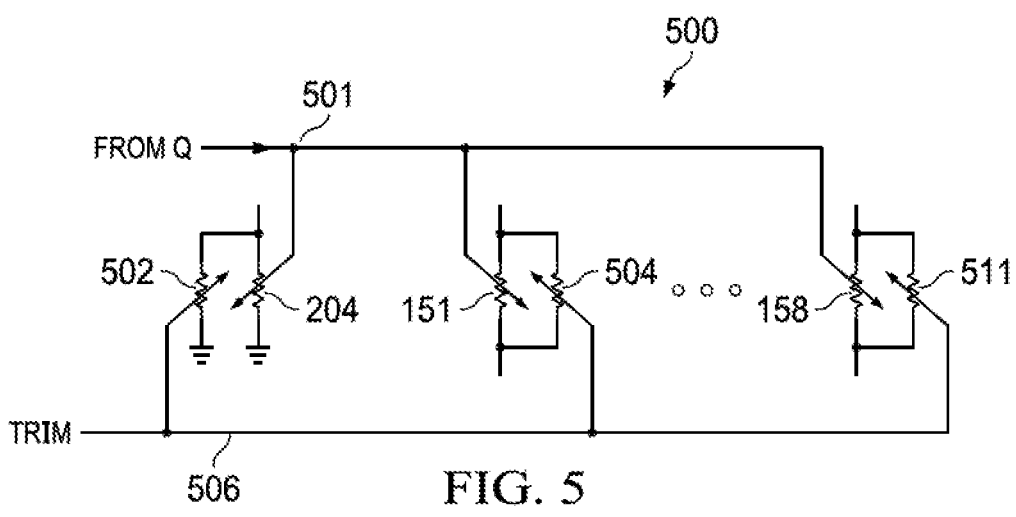
FIG. 5 depicts a circuit to perform a preliminary trim during factory testing to increase post-manufacturing trimming efficiency, in accordance with an example.

FIG. 5 depicts a circuit 500 to perform a preliminary trim during factory testing so that the post-manufacture trimming process is more efficient. The circuit 500 can couple to one or more of the example trim resistors described herein. The circuit 500 includes the trim resistor 204 and the external trim resistors 151-158. A trim device (e.g., a part of automated testing equipment) provides a bus 506 that is usable to trim a trim resistor 502 and multiple trim resistors 504-511. The resistors 502 and 504-511 are shown to be in parallel with resistors 204 and 151-158, respectively, but in other examples, a series configuration is used. The code on bus 506 that is used to trim the resistors 502 and 504-511 is initially selected on bus 501 to be approximately halfway in the range of possible codes (arranged sequentially). During factory testing, a premium external resistor 206 (e.g., FIGS. 2, 3, 4, 6) is applied to the Wheatstone bridge to which the resistors 204, 502 couple. A digital code is determined using the techniques described herein with respect to other examples. The digital code is then stored (e.g., in fuses, non-volatile memory) and is applied to the bus 506 whenever the device comprising the resistors 204 and 151-158 is powered on.

Figure 6:
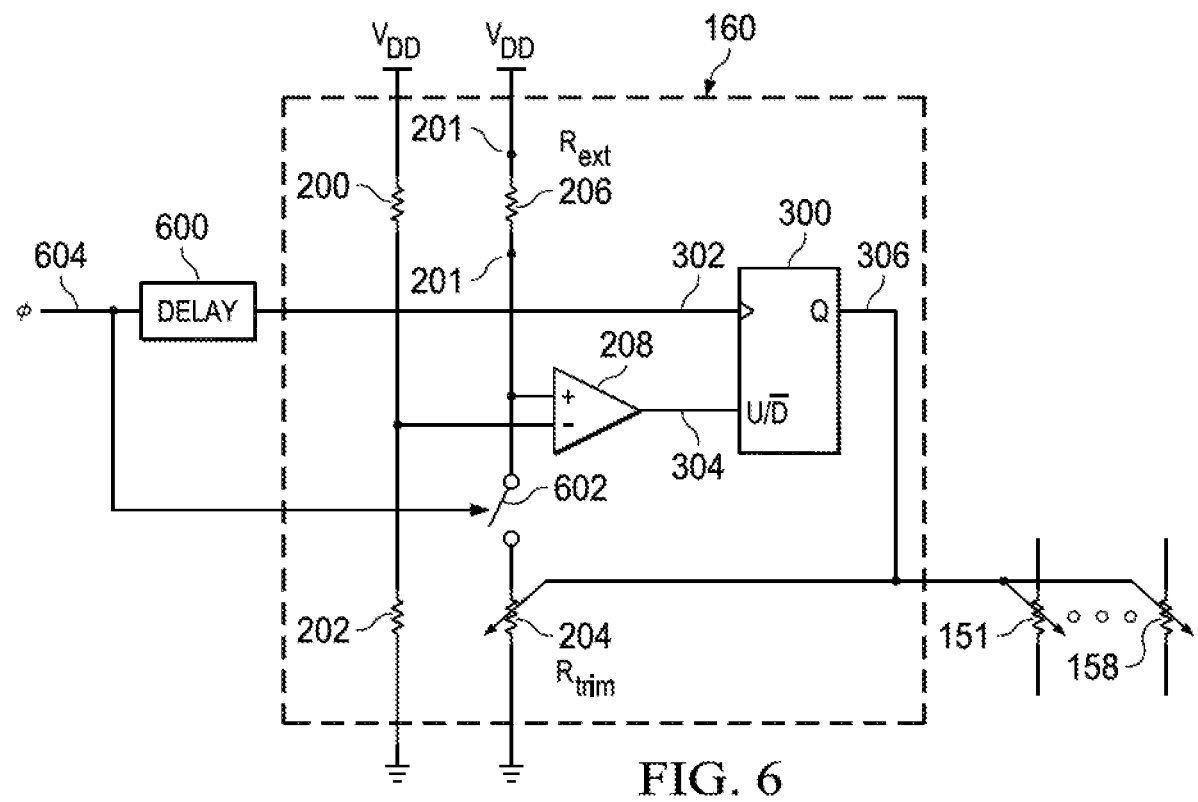
FIG. 6 depicts a circuit schematic diagram of another current sense circuit controller coupled to multiple integrated trim resistors, in accordance with an example.

FIG. 6 depicts a circuit schematic diagram of another current sense circuit controller 160 coupled to multiple integrated external trim resistors 151-158, in accordance with an example. The controller 160 of FIG. 6 differs from that of FIG. 3 in that the controller 160 of FIG. 6 includes a switch 602 (e.g., a transistor) positioned as shown. The external resistor 206 may draw large currents to overcome current leakage, and this represents an undesirable (and, at times, unnecessary) power drain. Thus, the switch 602 is closed just prior to each rising clock edge seen by the up-down counter 300 and is opened just after each falling clock edge seen by the up-down counter 300, thereby reducing the amount of time current flows through the external resistor 206. The switch 602 is controlled by the clock signal 604, which is delayed by a delay block 600 to produce the clock signal 302 used by the up-down counter 300. (In an example, the up-down counter 300 captures the input 304 only on rising clock edges.) The delay is provided so that the switch 602 is adjusted as described above before the up-down counter 300 captures the signal on input 304. The delay time can be as short as desired, so long as the switch 602 is in its desired state immediately prior to the capture of the signal provided on the input 304.

Figure 7A:
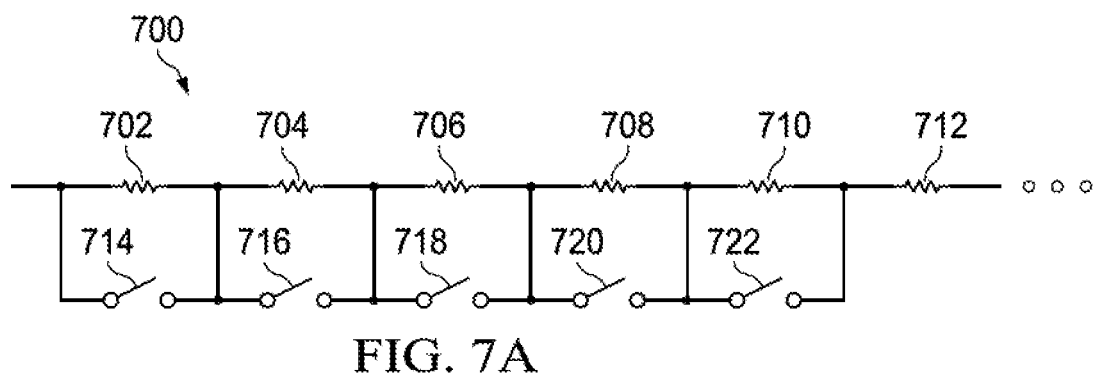
FIG. 7A depicts a circuit schematic diagram of a string digital-to-analog converter (DAC) in accordance with an example.

FIG. 7A depicts a circuit schematic diagram of a string digital-to-analog converter (DAC) 700 in accordance with an example. The string DAC 700 is illustrative of the various trim resistors depicted in the drawings and described herein. The trim resistors are not limited to a string DAC architecture; for example, a binary-weighted DAC may be used, as described below with respect to FIG. 7B. The string DAC 700 comprises multiple resistors 702, 704, 706, 708, 710, and 712, although any number of resistors may be used. In addition, the resistances of the resistors may be selected as desired, although in some examples, the resistances are approximately equal. The string DAC 700 further includes multiple switches 714, 716, 718, 720, and 722 (e.g., transistors). A digital code trims a trim resistor containing the string DAC 700 by manipulating the on-off states of the switches 714, 716, 718, 720, and 722.

Figure 7B:
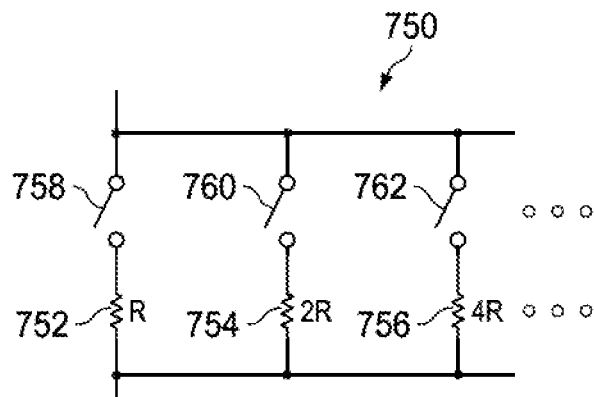
FIG. 7B depicts a circuit schematic diagram of a binary-weighted digital-to-analog converter (DAC) in accordance with an example.

FIG. 7B depicts a circuit schematic diagram of a binary-weighted digital-to-analog converter (DAC) 750 in accordance with an example, which may be used to implement one or more of the trim resistors described herein. The binary-weighted DAC 750 includes N resistors, such as resistors 752, 754, and 756. As shown, resistor 752 has a resistance R, resistor 754 has a resistance 2R, and resistor 756 has a resistance 4R. The digital code trims the trim resistor containing the binary-weighted DAC 750 by being applied at the switches 758, 760, and 762, thereby stopping or starting current flow through the corresponding resistor(s).

Figure 8:
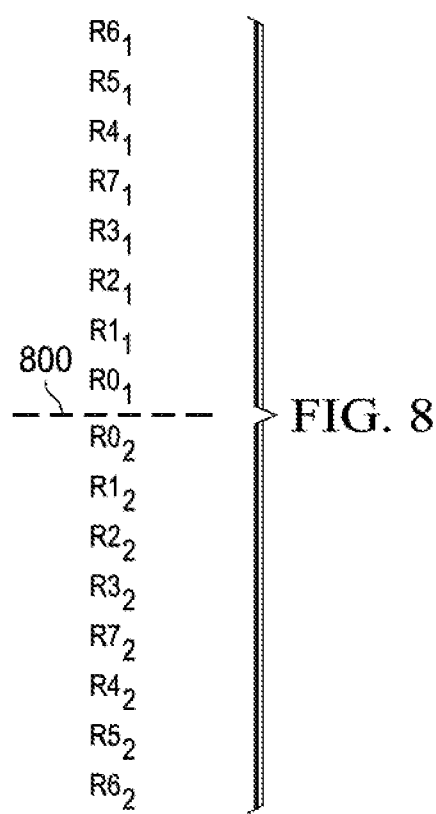
FIG. 8 depicts an integrated configuration of multiple trim resistors in accordance with an example.

FIG. 8 depicts an example configuration of multiple integrated trim resistors, such as the external trim resistors 151-158 described above. The configuration shown in FIG. 8 is an interdigitated pattern symmetrically arranged about a common centroid axis 800. In the example of FIG. 8, each trim resistor R0 . . . R7 is composed of two resistors electrically coupled in, e.g., a string DAC configuration as shown in FIG. 7A (although other configurations are also possible and fall within the scope of this disclosure). Thus, for example, a trim resistor R0 is composed of individual resistors $R0_1$ and $R0_2$, which are electrically coupled in a string DAC configuration and which are physically arranged symmetrically about the common centroid axis 800 as shown. Similarly, a trim resistor R1 is composed of individual resistors $R1_1$ and $R1_2$, which are electrically coupled in, e.g., a string DAC configuration and which are physically arranged symmetrically about the common centroid axis 800 as shown. The trim resistors are arranged symmetrically about the common centroid axis 800 in the pattern R0, R1, R2, R3, R7, R4, R5, R6, although any suitable interdigitation pattern may be used. By integrating the trim resistors in this (or a similar) manner, temperature gradients are mitigated. The scope of this disclosure is not limited to the integration techniques depicted in FIG. 8. Any suitable integration technique for mitigating the deleterious effects of environmental (e.g., temperature) variations on resistor performance are contemplated and included in the scope of this disclosure.

Figure 9:
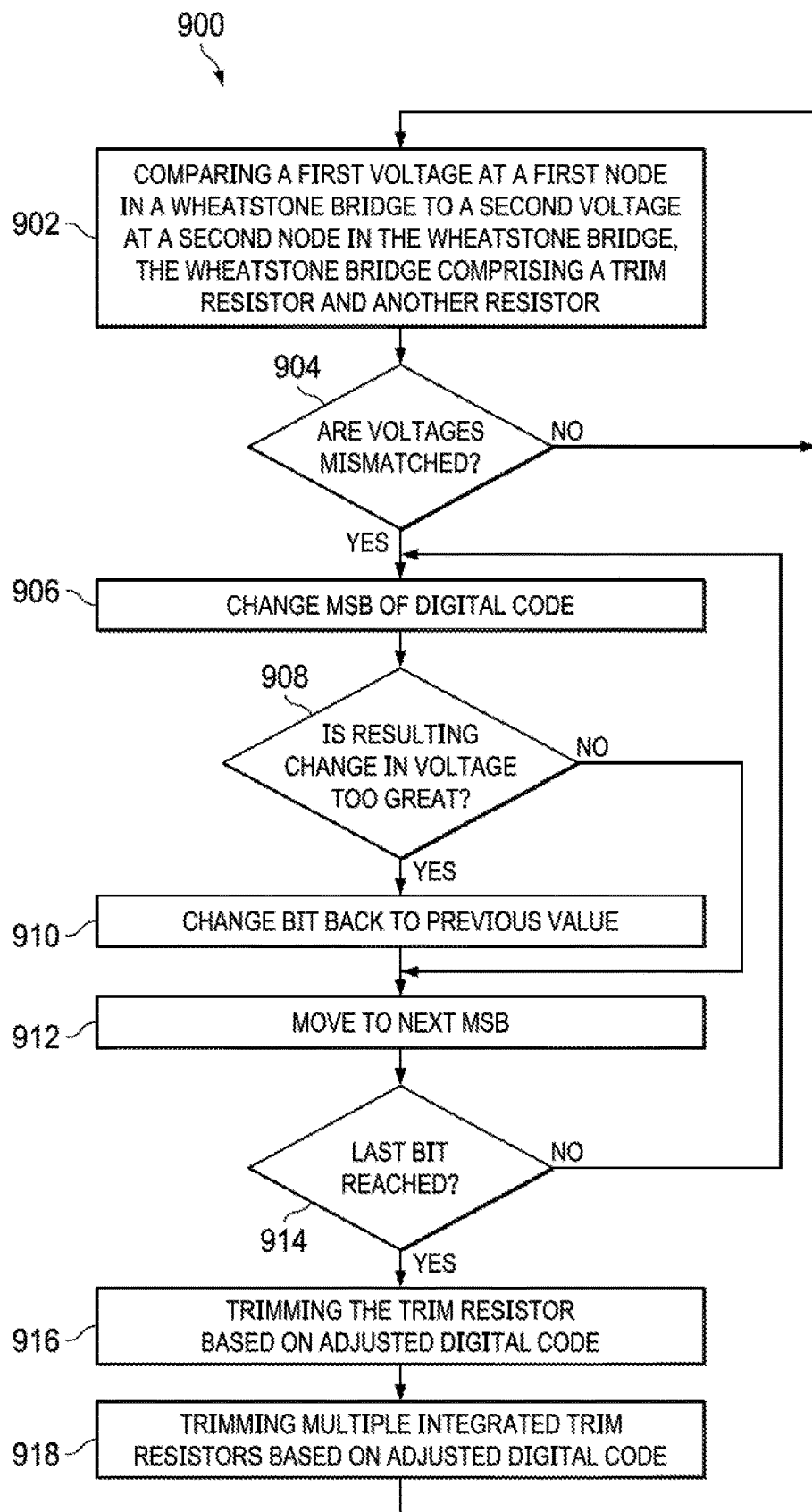
FIG. 9 depicts a flow diagram of a method for using a current sense circuit in accordance with an example.

FIG. 9 depicts a flow diagram of a method 900 of using a current sense circuit in accordance with an example. The method 900 begins by a comparator (e.g., comparator 208 of FIG. 2) comparing a first voltage at a first node in a Wheatstone bridge to a second voltage at a second node in the Wheatstone bridge, the Wheatstone bridge comprising a trim resistor and another resistor (e.g., an external resistor, such as external resistor 206 of FIG. 2) (902). The method 900 next includes the comparator determining whether the voltages are mismatched (904). If no mismatch is detected, control of the method 900 returns to 902. However, if a voltage mismatch is detected, the method 900 comprises a trim control circuit (e.g., the trim control circuit 210 of FIG. 2) changing the MSB of the digital code (e.g., used to program the trim resistor 204 of FIG. 2) (906). For example, if the MSB is a 0, it would be changed to a 1. In another example, if the MSB is a 1, it would be changed to a 0. The method 900 then comprises the comparator and the trim control circuit working in tandem to determine if the resulting change in voltage is too great (e.g., whether the voltage imbalance is now mismatched in the opposite direction vis-à-vis the mismatch of 904) (908). If so, the bit is changed back to the previous value (910). If not, however, the method 900 comprises moving to the next MSB (912). The method 900 then includes the trim control circuit determining whether the last bit has been reached (914). If not, control of the method 900 returns to 906. If so, however, the method 900 comprises the trim control circuit trimming the trim resistor based on the adjusted digital code (916) and trimming each of the multiple integrated trim resistors (e.g., external trim resistors 151-158 in FIG. 2) based on the adjusted digital code (918). For example, as explained above, the entire digital code would be applied to each individual trim resistor. Control of the method 900 then returns to 902.

In the foregoing discussion and in the claims, the terms "including" and "comprising" are used in an open-ended fashion, and thus should be interpreted to mean "including, but not limited to . . . ." An element or feature that is "configured to" perform a task or function may be configured (e.g., programmed or structurally designed) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Additionally, uses of the phrases "ground" or similar in the foregoing discussion are intended to include a chassis ground, an Earth ground, a floating ground, a virtual ground, a digital ground, a common ground, and/or any other form of ground connection applicable to, or suitable for, the teachings of the present disclosure. Unless otherwise stated, "about," "approximately," or "substantially" preceding a value means +/−10 percent of the stated value.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A device, comprising:
a port having first and second port terminals, wherein the port is adapted to be coupled to a model resistor to the device;
a first resistor having first and second leads;
a second resistor having third and fourth leads, wherein the third lead is coupled to the first lead, and the fourth lead is coupled to the first port terminal;
a trim resistor having fifth and sixth leads, the fifth lead coupled to the second lead, and sixth lead coupled to the second port terminal;
a comparator having a comparator output, an inverting input coupled to the fourth lead, and a non-inverting input coupled to the second lead; and
a trim control circuit having an input coupled to the comparator output, a first output coupled to the trim resistor, and a second output adapted to be coupled to multiple matched trim resistors.

2. The device of claim 1, wherein the multiple matched trim resistors include interdigitated trim resistors.

3. The device of claim 1, wherein the multiple matched trim resistors are arranged in a common centroid configuration.

4. The device of claim 1, wherein the trim control circuit includes an up-down counter.

5. The device of claim 1, wherein the trim control circuit includes a successive approximation register.

6. The device of claim 1, further including a hysteresis resistor having seventh and eighth leads, the seventh lead coupled to the first lead, and the eighth lead coupled to the third lead.

7. A system, comprising:
a device that includes:
a first resistor having first and second leads, the first lead coupled to a supply voltage terminal;
a second resistor having third and fourth leads, wherein the third lead is coupled to the second lead, and the fourth lead is coupled to a reference voltage terminal;
a port having a first port terminal coupled to the supply voltage terminal and having a second port terminal, wherein the port is adapted to couple a model resistor to the device;
a trim resistor having fifth and sixth leads, the fifth lead coupled to the second port terminal, and the sixth lead coupled to the reference voltage terminal;
a comparator having a comparator output, a noninverting input coupled to the fifth terminal and to the second port terminal, and having an inverting input coupled to the third terminal; and
a counter having an input coupled to the comparator output and having an output configured to adjust a digital code in response to the comparator output and to apply the digital code to the trim resistor, wherein the counter is further configured to apply the digital code to multiple matched trim resistors.

8. The system of claim 7, wherein the multiple matched trim resistors include interdigitated trim resistors.

9. The system of claim 7, wherein the multiple matched trim resistors are arranged in a common centroid configuration.

10. The system of claim 7, wherein the model resistor includes a thin film resistor.

11. The system of claim 7, wherein each of the multiple matched trim resistors includes a string digital-to-analog converter (DAC) configuration.

12. The system of claim 7, wherein each of the multiple matched trim resistors includes a binary weighted digital-to-analog converter (DAC) configuration.

13. The system of claim 7, further comprising a switch having a first terminal coupled to the noninverting input of the comparator and a second terminal coupled to the fifth terminal.

14. A method, comprising:
comparing a first voltage at a first node in a Wheatstone bridge in a device to a second voltage at a second node in the Wheatstone bridge, wherein the Wheatstone bridge includes a first trim resistor coupled to a first resistor, the first resistor having a first lead coupled to a first lead of a second resistor and having a second lead coupled to a first lead of a trim resistor, wherein a second lead of the second resistor and a second lead of the trim resistor are coupled to a port configured to be coupled to a model resistor external to the device;
adjusting a counter value responsive to the comparison;
trimming the first trim resistor responsive to the adjusted counter value; and
trimming matched trim resistors responsive to the adjusted counter value, the matched trim resistors including the first trim resistor.

15. The method of claim 14, wherein the matched trim resistors include interdigitated trim resistors.

16. The method of claim 14, wherein the matched trim resistors are arranged in a common centroid configuration.

17. The method of claim 14, wherein adjusting the counter value includes using an up-down counter.

18. The method of claim 14, wherein the Wheatstone bridge includes a hysteresis resistor.

19. A system, comprising:
a device, comprising:
a first resistor having a first terminal coupled to a supply voltage terminal and having a second terminal;
a hysteresis resistor having a first terminal coupled to the second terminal of the first resistor and having a second terminal;
a second resistor having a first terminal coupled to the second terminal of the hysteresis resistor and having a second terminal coupled to a reference supply terminal;
a trim resistor having a first terminal and having a second terminal coupled to the reference supply terminal;
a port having a first terminal coupled to the supply voltage terminal and a second terminal coupled to the first terminal of the trim resistor, the port configured to couple a model resistor to the device;
a first comparator having a first input coupled to the second terminal of the first resistor and a second input coupled to the second terminal of the port;
a second comparator having a first input coupled to the first terminal of the second resistor and a second input coupled to the second terminal of the port; and
an up/down counter having first and second inputs coupled to the outputs of the first and second comparators respectively, the up/down counter having an output coupled to the trim resistor.

20. The system of claim 19, further including multiple additional trim resistors coupled to the output of the up/down counter.

* * * * *